US009277660B1

(12) United States Patent
McBroom et al.

(10) Patent No.: US 9,277,660 B1
(45) Date of Patent: Mar. 1, 2016

(54) SCREWLESS JOINING OF AN ENCLOSURE WITH PRESSURE SENSITIVE ADHESIVE AND REMOVAL VIA PNEUMATIC RELEASE MECHANISMS

(71) Applicant: Apple Inc., Cupertino, CA (US)

(72) Inventors: Daniel L. McBroom, Leander, TX (US); Michael D. McBroom, Leander, TX (US); Matthew P. Casebolt, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/500,931

(22) Filed: Sep. 29, 2014

Related U.S. Application Data

(63) Continuation of application No. PCT/US2014/058090, filed on Sep. 29, 2014.

(51) Int. Cl.
*H05K 5/02* (2006.01)
*H05K 5/00* (2006.01)

(52) U.S. Cl.
CPC ............ *H05K 5/0217* (2013.01); *H05K 5/0004* (2013.01); *H05K 5/0086* (2013.01)

(58) Field of Classification Search
CPC .. H05K 5/0217; H05K 5/0004; H05K 5/0086
See application file for complete search history.

(56) References Cited

U.S. PATENT DOCUMENTS

| | | | | | |
|---|---|---|---|---|---|
| 5,252,916 A | * | 10/1993 | Swart | ................. | G01R 1/07307 324/754.15 |
| 5,813,876 A | * | 9/1998 | Rutigliano | ........... | H01R 12/853 439/260 |
| 6,195,255 B1 | * | 2/2001 | Kim | .................... | A47B 21/0371 248/118.1 |
| 7,930,837 B1 | * | 4/2011 | Huebner | ................ | A42B 1/002 12/114.4 |
| 8,099,879 B1 | * | 1/2012 | Huebner | ................ | A42B 3/006 12/114.2 |
| 8,780,556 B1 | * | 7/2014 | Ditri | .................... | H05K 7/1404 165/80.2 |
| 2003/0151222 A1 | | 8/2003 | Sutton et al. | | |
| 2009/0002941 A1 | | 1/2009 | Mongia et al. | | |
| 2009/0194445 A1 | | 8/2009 | Mongan et al. | | |
| 2011/0284108 A1 | | 11/2011 | Wang et al. | | |
| 2013/0107425 A1 | * | 5/2013 | Wright | ................ | H04M 1/0202 361/679.01 |
| 2013/0205508 A1 | * | 8/2013 | Hsu | ....................... | A47C 27/083 5/713 |
| 2014/0160655 A1 | * | 6/2014 | Yebka | ................. | H01M 2/1066 361/679.21 |

FOREIGN PATENT DOCUMENTS

WO 2013131388 A1 9/2013

OTHER PUBLICATIONS

International Search Report and Written Opinion mailed May 29, 2015 for PCT Application No. PCT/US2014/058090.

* cited by examiner

*Primary Examiner* — Adrian S Wilson
*Assistant Examiner* — Abhishek Rathod
(74) *Attorney, Agent, or Firm* — Downey Brand LLP

(57) ABSTRACT

This application relates to methods and apparatus for pneumatically separating adhesively joined components. A pneumatic release mechanism can be positioned between the adhesively joined components. The pneumatic release mechanism can be positioned adjacent to or within an adhesive joint so that when it is filled with air the pneumatic release mechanism can exert a force on the joined components sufficient to sever the adhesive bond. In some embodiments, the joined components can be housing components. In other embodiments, the joined components can be a battery cell and a housing component.

19 Claims, 9 Drawing Sheets

US 9,277,660 B1

SCREWLESS JOINING OF AN ENCLOSURE WITH PRESSURE SENSITIVE ADHESIVE AND REMOVAL VIA PNEUMATIC RELEASE MECHANISMS

CROSS REFERENCE TO RELATED APPLICATIONS

This application is a continuation of International Application No. PCT/US14/58090 with an international filing date of Sep. 29, 2014, entitled "SCREWLESS JOINING OF AN ENCLOSURE WITH PRESSURE SENSITIVE ADHESIVE AND REMOVAL VIA PNEUMATIC RELEASE MECHANISMS," which is incorporated herein by reference in its entirety for all purposes.

FIELD

The described embodiments relate generally to methods and apparatus for separating joined components. More particularly, compressed gas can be introduced into a pneumatic release mechanism positioned between the components to separate adhesively joined components.

BACKGROUND

A housing formed from multiple housing components allows convenient access to interior portions of the housing when the housing components can be separated. Separation of the housing components provides convenient access to internal device components during both assembly and rework applications. Unfortunately, when a number of housing components are joined to form the housing, fasteners used to join the housing components generally cause at least one of two problems. In some cases the fasteners remain visible after the various housing components are joined. For example, a screw head may be left visible along an outside surface of the housing. This can prevent a sleek and unbroken cosmetic surface from being achieved. Alternative joining methods can be used that do not result in visible screw heads marring a cosmetic surface of a housing. For example, adhesive joints do not typically require visible fasteners; unfortunately, adhesive bonds do tend to be permanent or at least semi-permanent in nature. Many adhesive joints are difficult to remove because it can be difficult to get a removal tool between the housing components to exert a separating force from an effective position. In some cases, wedging the removal tool between the parts to achieve that effective position can take time and the wedging of the removal tool between the components can cause scrapes and/or gouges on one or more cosmetic surface of the housing components. For at least these reasons, disassembly of an adhesively joined housing can be a lengthy process with a high potential for causing damage to the housing components.

SUMMARY

This paper describes various embodiments that relate to pneumatically separating adhesively joined housing components.

An electronic device is disclosed. The electronic device includes at least the following elements: a first component having a first surface and defining an air inlet extending through a wall of the first component; a second component having a second surface; an adhesive layer in direct contact with both the first surface and the second surface; and a pneumatic release mechanism coupled with the air inlet of the first component and positioned proximate the first surface. The first component is separated from the second component when the pneumatic release mechanism is inflated.

A self-releasing adhesive layer is disclosed. The self-releasing adhesive layer is configured to joining a first component to a second component. The self-releasing adhesive layer includes at least the following: an adhesive substrate; and a pneumatic release mechanism at least partially embedded within the adhesive substrate. The pneumatic release mechanism severs a bond formed by the adhesive substrate between the first and second components when the pneumatic release mechanism is inflated.

A portable electronic device is disclosed. The portable electronic device includes at least the following: a first housing component; a second housing component that cooperates with the first housing component to define an interior volume; an adhesive layer joining the first housing component to the second housing component at a bonding region; and a pneumatic release mechanism at least a portion of which is disposed within the interior volume. The pneumatic release mechanism is configured to separate the first housing component from the second housing component when the pneumatic release mechanism is inflated.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
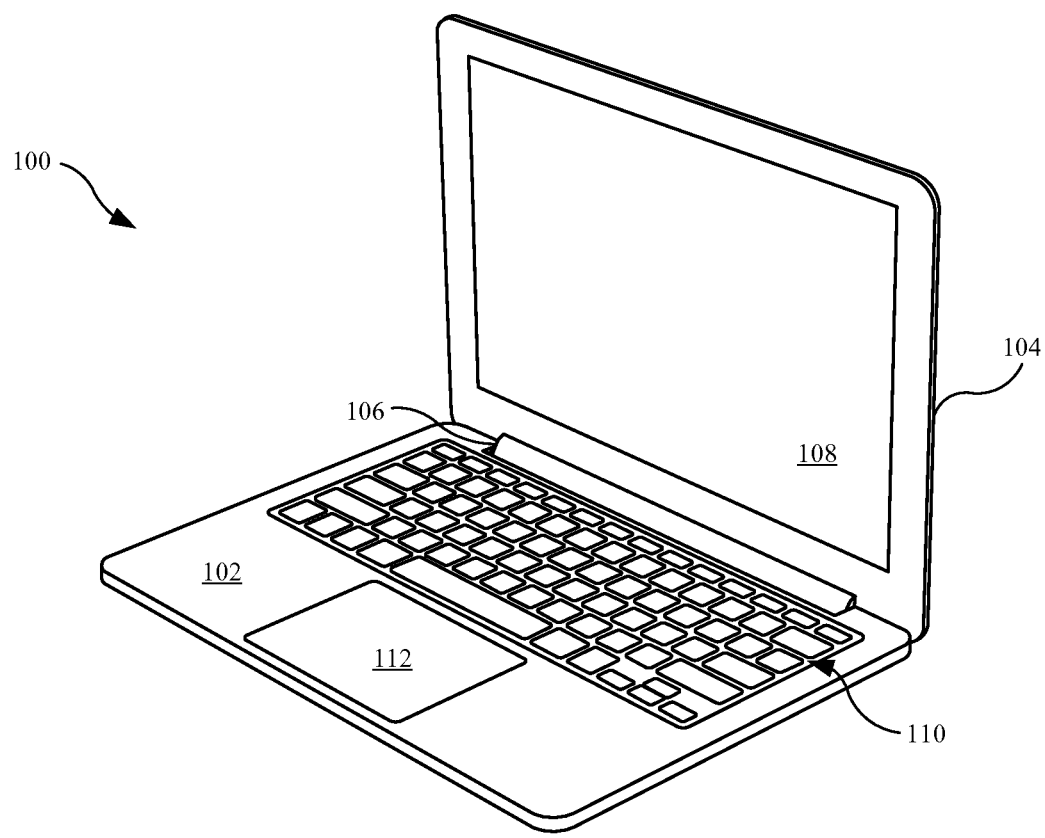
FIGS. 1A-1B show perspective views of an exemplary portable computing device suitable for use with the described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Adhesively joined components can be particularly difficult to separate. In many cases, separation of adhesively joined components can cause damage to at least one of the joined components; the damage can be severe enough to prevent reuse of the damaged component. Frequently, the difficulty in separating the components lies in not being able to exert a separation force in an effective position. For example, when housing components are adhesively joined, an interface between the components can make it difficult to grip the housing components and exert an effective force that facilitates disassembly. In such a case, a prying tool might be employed to apply a force between the housing components. Unfortunately, the prying tool can cause dents, scratches, and/or deformation of the housing components to an extent where the housing components require replacement or at minimum time consuming or costly rework.

One solution to this issue is to pre-position a pneumatically actuated apparatus in close proximity to the adhesive bonds. When the pneumatically actuated apparatus is actuated it can exert the force necessary to decouple the joined components. In some embodiments, the pneumatically actuated apparatus can be positioned adjacent to an adhesive coupling while in other embodiments the pneumatically actuated apparatus can be integrated into the adhesive bond layer itself. In either configuration the pneumatically actuated apparatus is positioned so that the pneumatically actuated apparatus exerts a separating force on the joined components. In some embodiments, the pneumatically actuated apparatus includes a manifold for distributing compressed air to a number of different locations. The manifold can be equipped with an air intake positioned in an accessible location. In this way a compressed air source can be coupled with the manifold so that the pneumatically actuated apparatus can be actuated.

These and other embodiments are discussed below with reference to FIGS. 1A-8; however, those skilled in the art will readily appreciate that the detailed description given herein with respect to these figures is for explanatory purposes only and should not be construed as limiting.

Figure 1B:
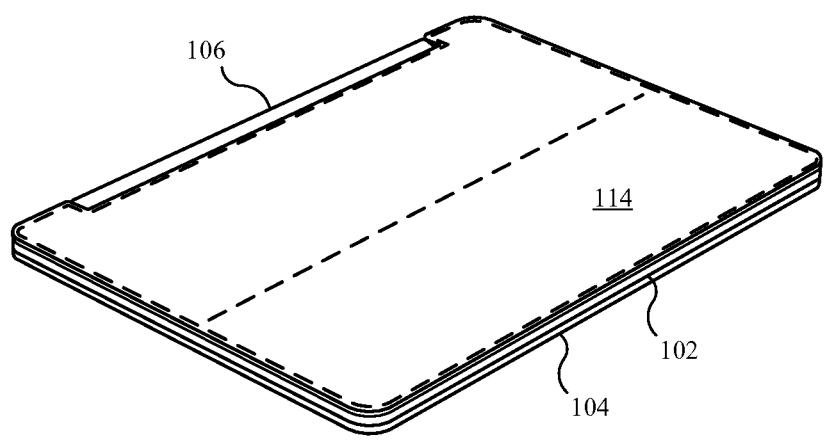

FIG. 1A shows an exemplary electronic device 100 suitable for use with the described embodiments. In some embodiments, electronic device 100 can be a portable electronic device along the lines of a laptop computer. Electronic device 100 includes one housing component that takes the form of base 102 pivotally coupled to lid 104 by hinge assembly 106. Lid 104 can include a number of electrical components that include at least circuitry for supporting display assembly 108. In some embodiments, lid 104 can also include internal antennas for sending and receiving wireless signals. Base 102 can include a number of user interface components such as keyboard 110 and track pad 112 with which a user can interact with electronic device 100. FIG. 1B shows a perspective view of a bottom portion of electronic device 100. In particular, a housing component taking the form of bottom cover 114 is depicted, which is operable to close an opening leading into base 102. In this way, bottom cover 114 and base 102 cooperate to define an internal volume within which internal components can be positioned and protected. The depicted dashed lines show positions at which bottom cover 114 can be adhesively coupled with base 102. While bottom cover 114 is depicted taking the form of a substantially flat bottom cover it should be understood that the bottom cover can also have other geometries along the lines of a curved geometry, in which case bottom cover 114 may only contact base 102 along a periphery of base 102.

Figure 2:
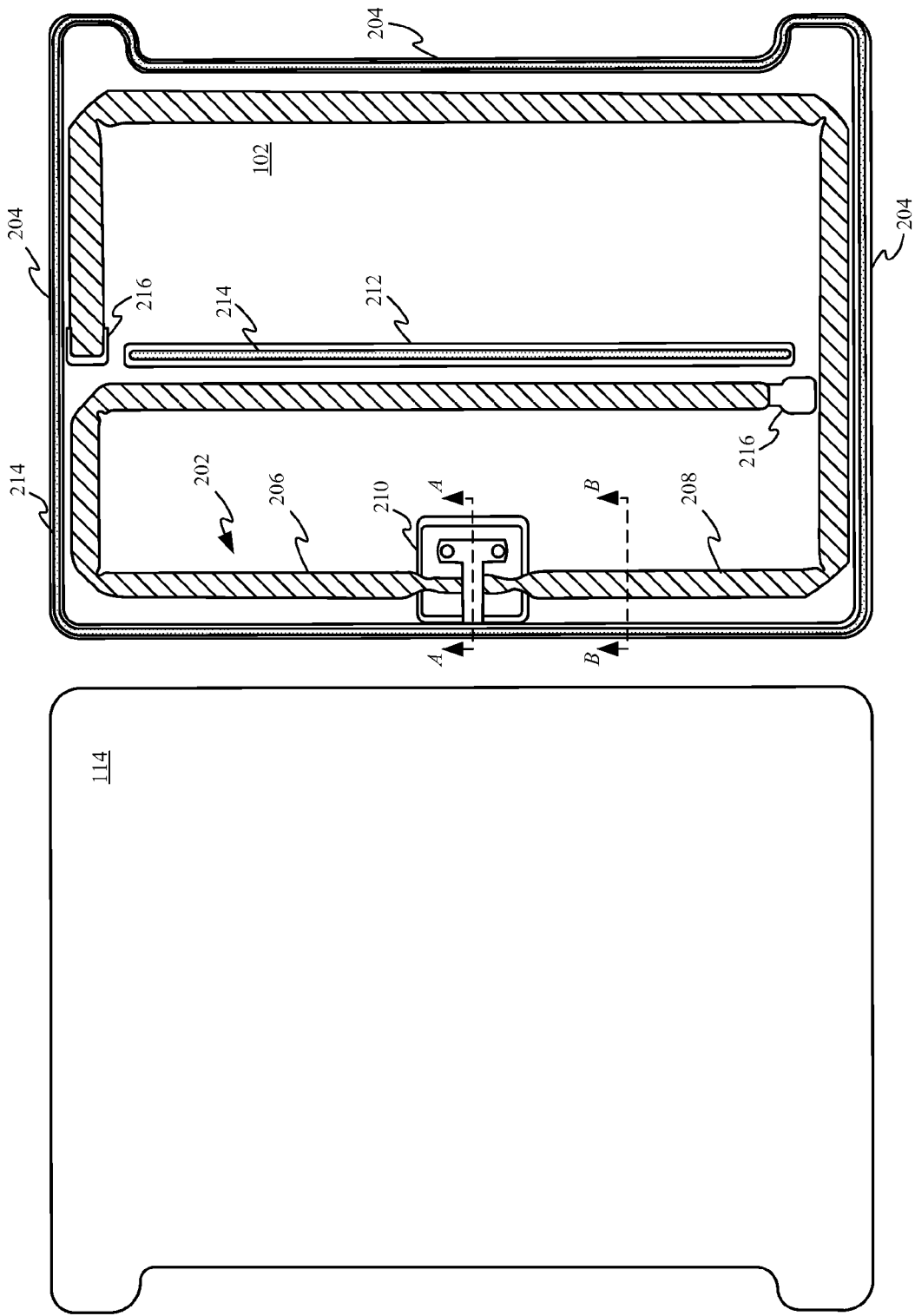
FIG. 2 shows an interior view of a base of the portable computing device and an interior-facing surface of a bottom cover.

FIG. 2 shows an interior view of base 102 and an interior-facing surface of bottom cover 114. A pneumatic release mechanism taking the form of bladder system 202 is depicted in a configuration that places it next to sidewalls 204 of base 102. Bladder system 202 includes two separate inflatable members 206 and 208, which extend away from inlet manifold 210 in different directions. A portion of inflatable member 206 is also arranged along central rib 212. Adhesive layers 214 are arranged across top surfaces of both sidewalls 204 and central rib 212. In this way, when bottom cover 114 is compressed against base 102 adhesive layers 214 create robust adhesive bonds between bottom cover 114 and base 102 at a bonding area defined by an interface between bottom cover 114 and sidewalls 204 and central rib 212. Although a specific configuration is depicted, it should be understood that by arranging bladder system 202 next to the bonding areas, a force exerted by bladder system 202 while the inflatable members are inflated can be concentrated in close proximity to the bonding areas. In addition to being arranged next to the bonding areas, bladder system 202 can be engaged with inlet manifold 210. Inlet manifold 210 can include a number of fittings around which an opening in each of inflatable members 206 and 208 can be engaged. Once coupled with inflatable members 206 and 208 inlet manifold 210 can be arranged to receive and distribute air to each of inflatable members 206 and 208.

While FIG. 2 depicts inlet manifold 210 being arranged to distribute air in two different directions to two different inflatable members, it should be understood that inlet manifold 210 can direct incoming air in any number of directions to any number of separate inflatable members. In some cases, inlet manifold 210 can be configured to direct air in a first direction and then subsequently in a second direction so that various inflatable members of bladder system 202 are inflated in a predetermined order. For example, a valve of inlet manifold 210 leading into inflatable member 206 can be configured to open only once a predetermined air pressure was reached within inflatable member 208. In this way, particular portions of the adhesive bond can be targeted. In some embodiments, a portion of the bond could be weakened in a particular location that corresponds to an inflatable member receiving air first. In such a configuration, a relatively lower force can be needed to sever the adhesive bond. Inlets associated with inlet manifold 210 will be described in more detail in FIGS. 3A-3B. Bladder system 202 can be at least partially secured in place within base 102 by securing tabs 216. In this way bladder system 202 can be prevented from shifting out of place. In some embodiments, bladder system 202 can include additional attachment points to keep it positioned adjacent to sidewalls 204 and central rib 212. It should be noted that in some embodiments, bladder system 202 can be reused; however the severed adhesive layers generally need replacing when adhesively re-bonding base 102 and bottom cover 114.

Figure 3A:
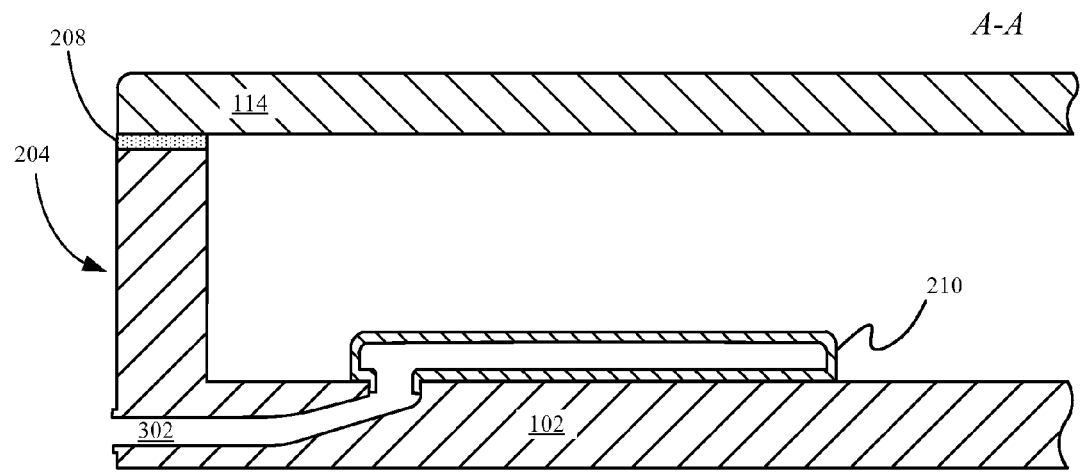
FIGS. 3A-3B show cross-sectional views of the base and an inlet manifold in accordance with section line B-B.
Figure 3B:
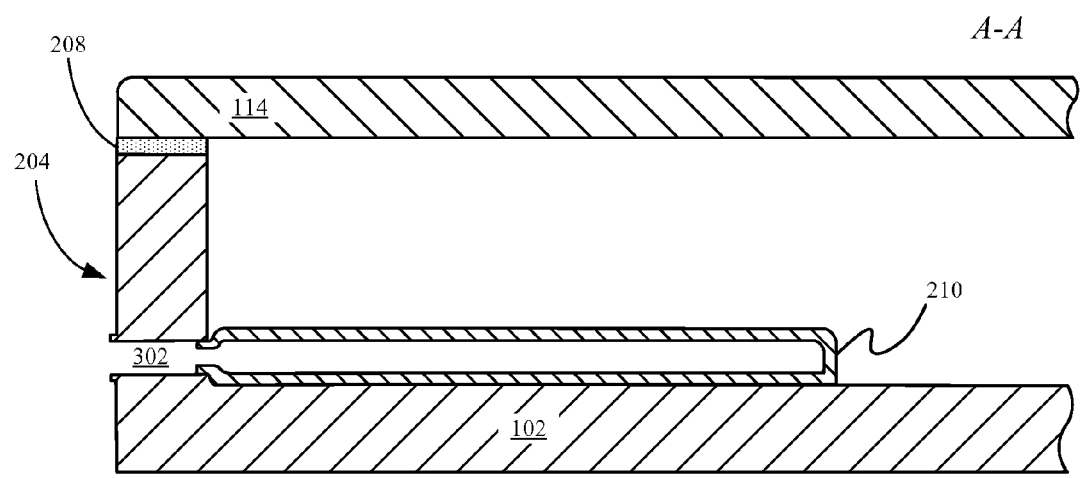

FIGS. 3A-3B show cross-sectional views of base 102 and inlet manifold 210 in accordance with section line B-B. In some embodiments, air inlet 302 can run through a bottom surface of base 102 as depicted in FIG. 3A, while in other embodiments air inlet 302 can be defined by sidewall 204, as depicted in FIG. 3B. In either case, an air supply fitting can be attached to an exterior opening of air inlet 302 so that air can be introduced into inlet manifold 210 and subsequently distributed to bladder system 202 (not depicted). As described above, inlet manifold can include a number of valves that regulate an order in which various inflatable members receive compressed gas. Each valve can be configured to open in response to any of a number of stimuli. For example, one valve can be configured to open once a predetermined pressure has been achieved within inlet manifold 210 while another valve can be configured to open after a certain amount of time has passed.

Figure 4A:
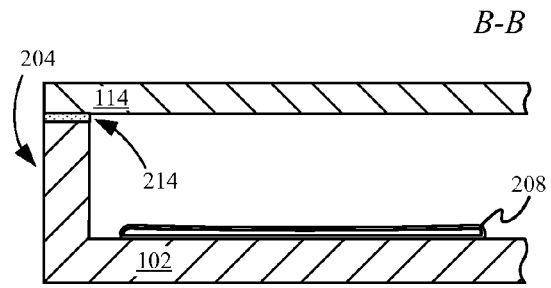
FIG. 4A shows a cross-sectional view of the base and an uninflated pneumatic release mechanism in accordance with a section line depicted in FIG. 2.
Figure 4D:
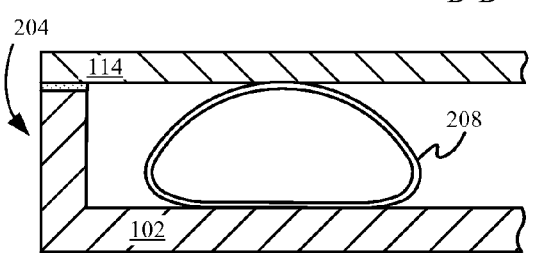
FIGS. 4B-4F show cross-sectional views of the base and the pneumatic release mechanism as it the pneumatic release mechanism is inflated and separates two housing components.
Figure 4B:
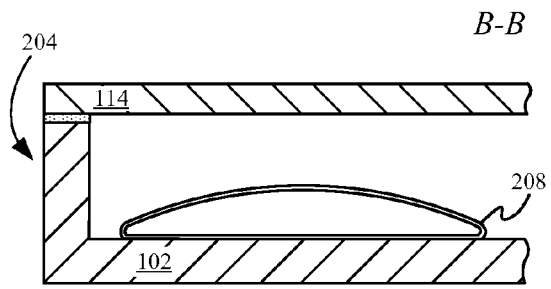
Figure 4E:
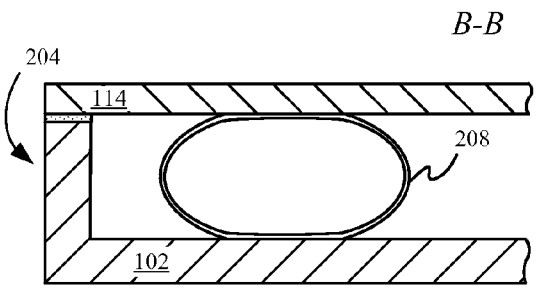
Figure 4C:
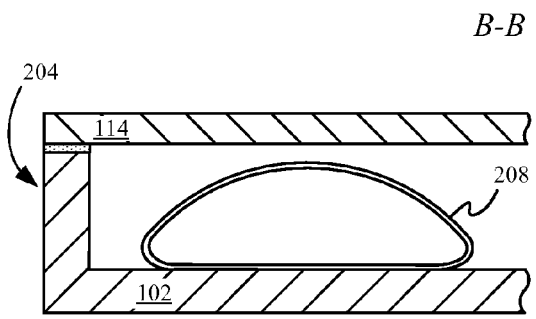
Figure 4F:
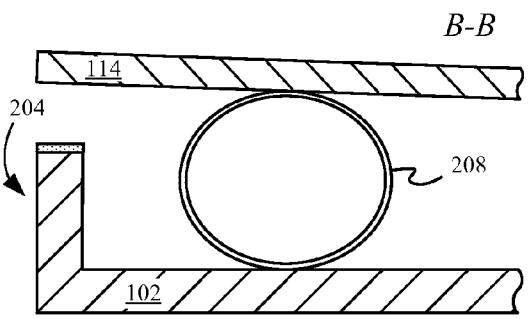

FIGS. 4A-4F show cross-sectional views of base 102 and inflatable member 208 in accordance with section line B-B, in which bottom cover 114 is engaged with sidewall 204. FIG. 4A shows inflatable member 208 in a deflated state. Once air is distributed to inflatable member 208 by inlet manifold 210, inflatable member 208 begins to stretch away from an interior surface of base 102 and towards an inside surface of bottom cover 114 as depicted in FIGS. 4B-4C. FIGS. 4D-4E show inflatable member 208 exerting force upon both base 102 and bottom cover 114 until a bond between bottom cover 114 and sidewall 204, formed by adhesive layer 214, is finally severed, as depicted in FIG. 4F. Inflatable member 208 can amount to a length of elastomeric tubing and can be formed from any number of flexible materials such as for example rubber, plastic or heat-shrunk tubing. While inflatable member 208 is shown as having a substantially circular geometry when full inflated (see FIG. 4F), a cross-sectional geometry of inflatable member 208 can be optimized to avoid interference with other adjacent internal devices positioned within base 102. For example, inflatable member 208 can have a vertically oriented ellipsoid-shaped cross-sectional geometry that can exert force upon bottom cover 114 without preventing other internal components from being arranged in close proximity to inflatable member 208.

Figure 5A:
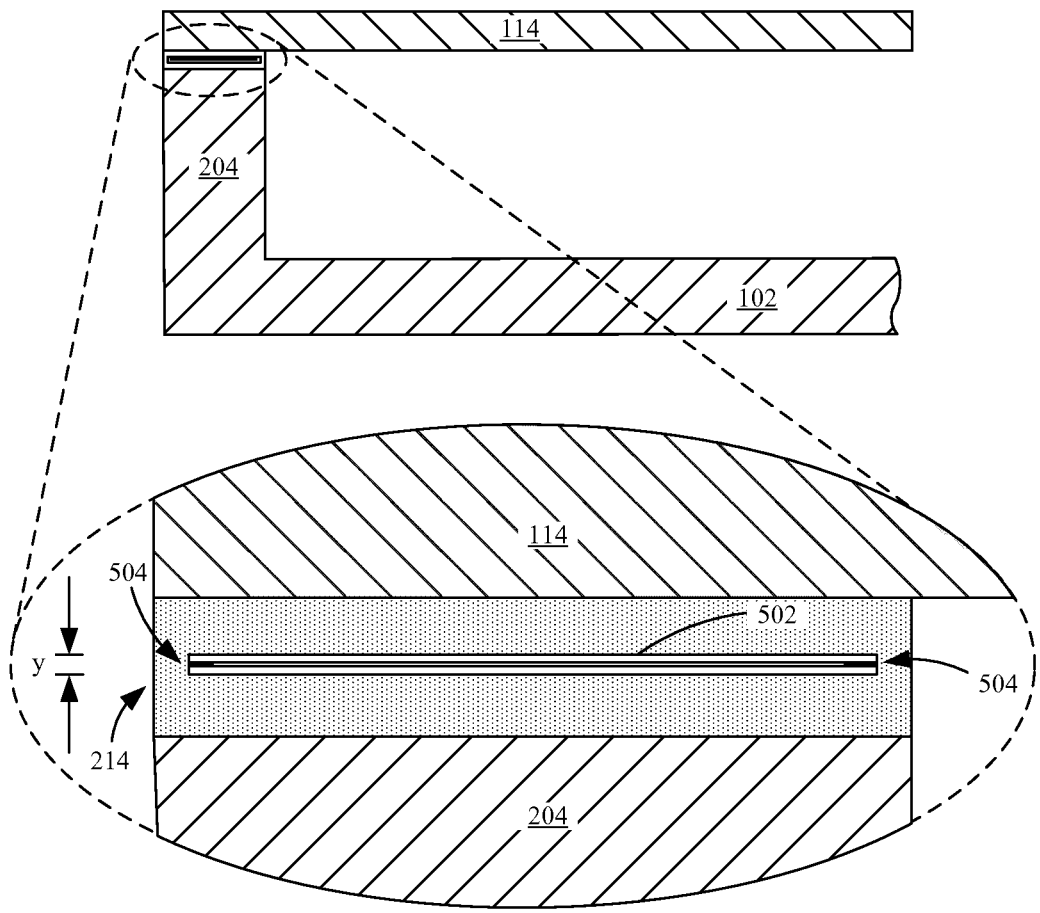
FIG. 5A shows a cross-sectional view of a sidewall of the base being adhesively coupled with the bottom cover by an adhesive layer.

FIG. 5A shows a cross-sectional view of sidewall 204 of base 102 adhesively coupled with bottom cover 114 by an adhesive layer 214. In this embodiment, adhesive layer 214 includes an integrated, low-profile bladder system. Low profile bladders system can be embedded within adhesive layer 214 as depicted. In some embodiments, the low profile bladders system can be constructed of two thin sheets of polyester film 502, along the lines of a Mylar® film, each sheet having a thickness of about 15 microns. An outer periphery of each of the two polyester films 502 can be heat sealed to each other at locations 504. By forming the layer with thin, but resilient substrates the low profile bladder system can be added to the adhesive layer 214 without substantially increasing an overall height of adhesive layer 214, as a combined height y of about 30 microns. In this way, the bladder system becomes a substantially zero thickness adder that facilitates convenient removal of bottom cover 114 without adding substantial height to the bond layer.

Figure 5B:
FIG. 5B shows a top view of a low-profile bladder system arranged in a strip of pressure sensitive adhesive.

FIG. 5B shows a top view of adhesive layer 214 used to join sidewall 204 to bottom cover 114. In some embodiments, adhesive layer 214 can be formed primarily of pressure sensitive adhesive. Adhesive layer 214 can be described as a self-releasing pressure sensitive adhesive, because a pneumatic release mechanism is embedded within a layer of pressure sensitive adhesive. As depicted, the pneumatic release mechanism taking the form of the low-profile bladder system described in conjunction with FIG. 5A can include a connecting end 506 that protrudes from a pressure sensitive adhesive substrate to facilitate attachment to an inlet manifold, along the lines of the manifolds previously depicted. In such a configuration, the low-profile system can be heat sealed all along the outer periphery of an intersection between the sheets of polyester film 502 leaving an opening only at connecting end 506. In some embodiments, adhesive layer 214 can include an amount of closed cell foam. When the low profile bladder system receives compressed air from an inlet manifold, sheets of polyester film 502 separate as the compressed gases expand between the sheets of polyester film 502, which subsequently causes the adhesive coupling between bottom cover 114 and base 102 to be severed or at least sufficiently weakened to a point where bottom cover 114 can be easily removed from sidewall 204. It should be noted that while connecting end 506 is depicted as having a shaped end, adhesive layer 214 can be manufactured by removing adhesive layer 214 from a roll of adhesive which includes the embedded low-profile bladder system. Once adhesive layer 214 is released from the adhesive roll portions of the adhesive substrate can be removed, thereby allowing one end to be closed and another end to be configured to receive compressed air.

Figure 6:
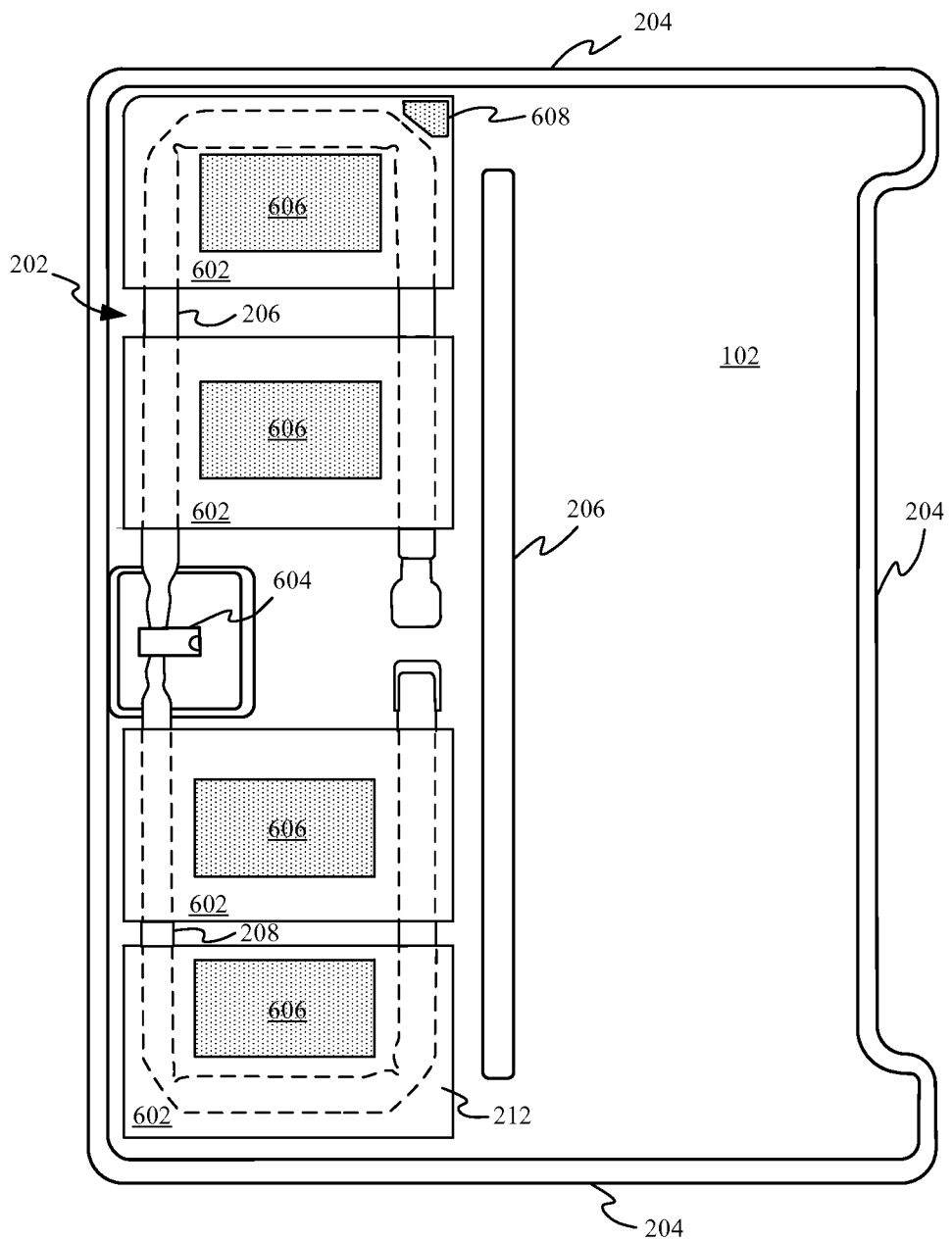
FIG. 6 shows an alternative embodiment in which a bladder system is configured to facilitate the release of a number of battery cells from the base.

FIG. 6 shows an alternative embodiment in which bladder system 202 is configured to release battery cells 602 from base 102. As depicted, manifold 604 is configured to receive air or any other compressed gas at an entrance defined within base 102. Because bladder system 202 extends under each of battery cells 602, adhesive layers 606 coupling battery cells 602 to base 102 can be released by injecting compressed air or some other compressed gas into bladder system 202 by way of inlet manifold 604. As depicted, bladder system 202 includes only one inlet manifold 604. In some embodiments, manifold 604 can be configured to direct air into inflatable members 206 and 208 concurrently. In some embodiments, manifold 604 can be configured to direct air into only one of inflatable members 206 and 208. In other embodiments, a direction in which inlet manifold 604 can be directed by a processor in communication with manifold 604. For example, if one of battery cells 602 is determined to be degraded but the remaining battery cells 602 are still properly functioning, the processor can be configured to direct manifold 604 to direct air only towards the inflatable member that releases the degraded battery cell 602. It should be not that while only a this singular manifold is depicted, bladder system can include multiple manifolds and/or multiple bladder systems to help provide control over how, when and in what order the adhesively coupled components are released. In this way, individual battery cells can be targeted for removal without removing all the battery cells at once. While bladder system 202 is depicted in a position adjacent to adhesive layers 606 it should be understood that bladder system 202 can also be integrated into adhesive layers 606. For example, by positioning adhesive immediately adjacent to and over bladder system 202 so that bladders system is included in an adhesive stack, bladder system 202 can be even more effective at disrupting the adhesive coupling between battery cells 602 and base 102. In some embodiments, bladders system 202 can be arranged between various adhesive layers. For example, inflatable member 206 runs between one of adhesive layers 606 and adhesive layer 608.

Figure 7:
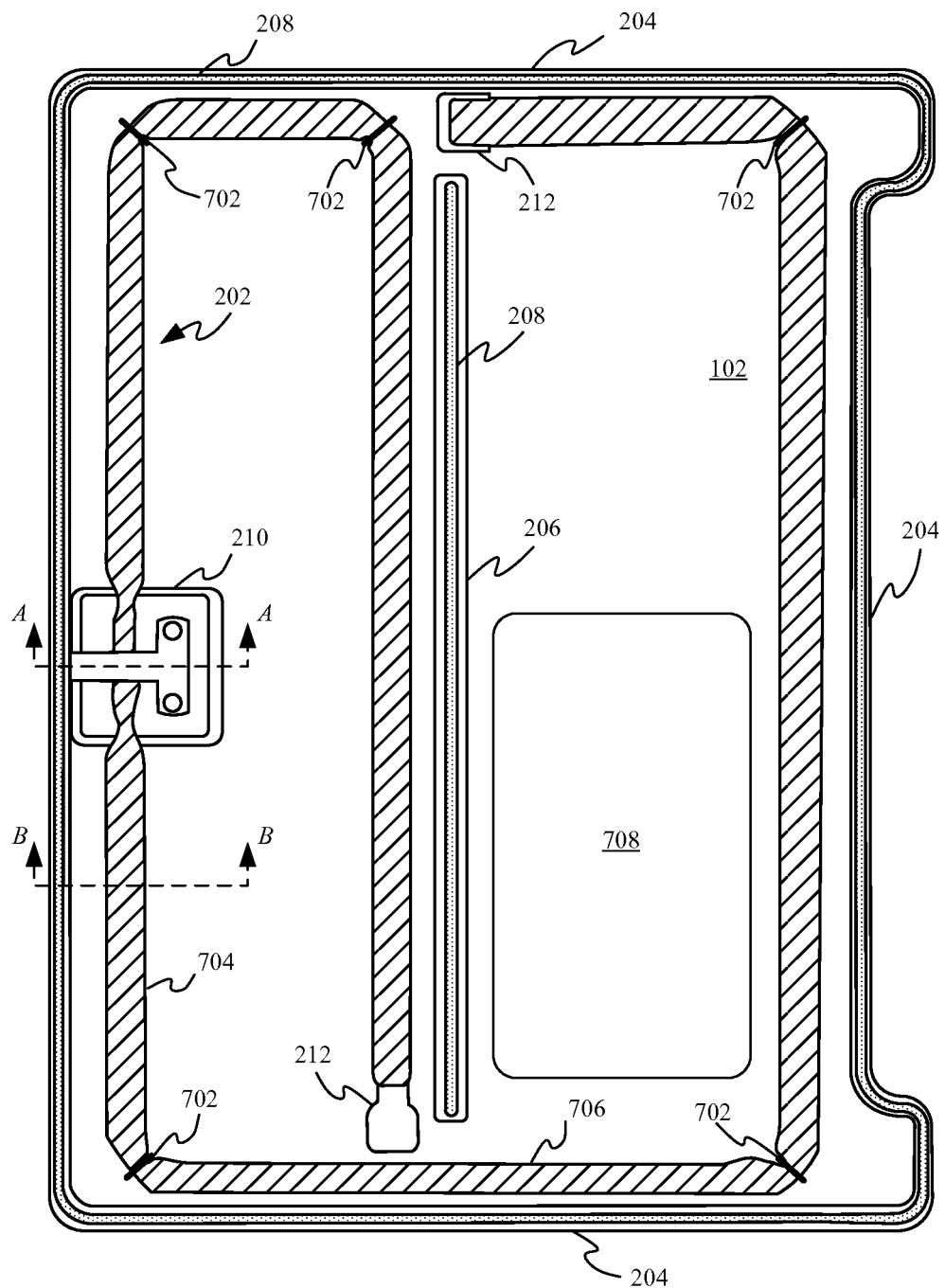
FIG. 7 shows an alternative embodiment of the configuration depicted in FIG. 2, in which the bladder system includes a number of staged releases mechanisms.

FIG. 7 shows an alternative embodiment of the configuration depicted in FIG. 2. In this configuration bladder system 202 includes a number of staged releases 702. Staged releases 702 can build in a delay into an actuation of various portions of bladder system 202. For example, staged release mechanisms 702 can be embodied as weak heat seals in bladder system 202. Heat seal 702 positioned between segment 704 and 706 of bladder system 202 can allow segment 704 to inflate and decouple a first portion of bottom cover 114 (not depicted) from base 102 prior to inflating segment 706. After the first portion is decoupled the heat seal can release allowing segment 706 of bladder system 202 to inflate. Because a first portion of the adhesive coupling is already broken, subsequently released segments of bladder system 202 can cause a remaining portion of the adhesive connection to be sheared apart.

In some embodiments, staged release mechanisms 702 can be embodied by timed releases and/or pressure sensor actuated release mechanisms that only actuate once a predetermined pressure has been reached or a predetermined amount of time has elapsed. In some embodiments, various ones of staged release mechanisms 702 can be configured to release or open at different predetermined pressures. The predetermined pressures can be optimized during a testing process in which an ideal amount of pressure can be determined. In still other embodiments, segment 704 of bladder system 202 can be smaller than segment 706 since after an initial portion of the adhesive layer has been separated a remaining portion of the adhesive bond joining the components can be severed with substantially less force. By reducing a size of bladder system 202 base 102 can have an increased amount of space for accommodating various internal components within base 102, such as for example internal component region 708. Internal component region 708 can represent any number of internal components suitable for use with an electronic device. For example, a printed circuit board and/or integrated circuit could be positioned within or proximate to internal component region 708. In some embodiments these internal components can interact with and direct various aspects of bladder system 202.

Figure 8:
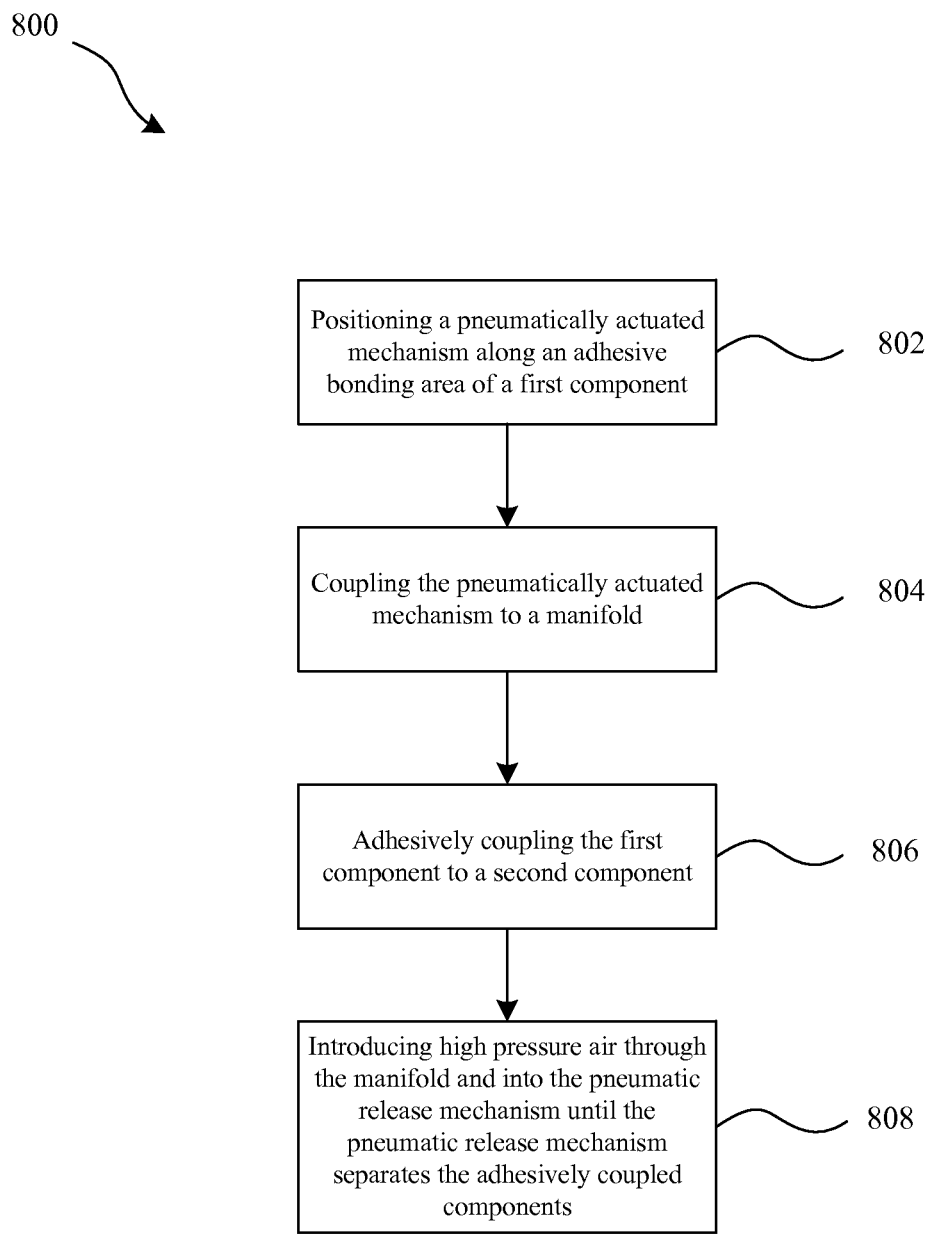
FIG. 8 shows a flow diagram representing a method of installing a pneumatically actuated mechanism for releasing an adhesive coupling.

FIG. 8 shows a flow diagram 800 representing a method of installing a pneumatically actuated mechanism for releasing an adhesive coupling. In a first step 802 the pneumatically actuated mechanism is attached to a first component, adjacent to a surface configured to be adhesively coupled to a second component. In some embodiments, the pneumatically actuated mechanism can be integrated with a layer of adhesive configured to couple the first and second components. For example, the adhesive can be formed around at least a portion of the pneumatically actuated mechanism so that actuation of the mechanism immediately begins to disrupt an adhesive coupling. At step 804, the pneumatically actuated mechanism is coupled with a manifold having an opening for receiving air to inflate the pneumatically actuated mechanism. In some embodiments, the manifold can be attached to a number of pneumatically actuated mechanisms. In any case, the opening is configured to allow access to it after the first and second components are adhesively joined. In this way, air or any other gas can be introduced to the pneumatically actuated mechanism through the manifold even when the components are adhesively coupled. At step 806, high pressure gas is introduced through the manifold and into at least one pneumatically actuated mechanism, causing the pneumatically actuated mechanism to expand rapidly and exert a force upon the two adhesively joined components. In some embodiments, the pneumatically actuated mechanism can be an elastomeric tube that expands to separate, which in turn exerts a strong force on the joined components sufficient to separate the two components. In some embodiments, the pneumatically actuated mechanism can be configured to inflate in segments so that an adhesive bond between the components is severed in a first location and then gradually separated in a direction extending away from the location where the adhesion bond begins to separate.

Figure 9:
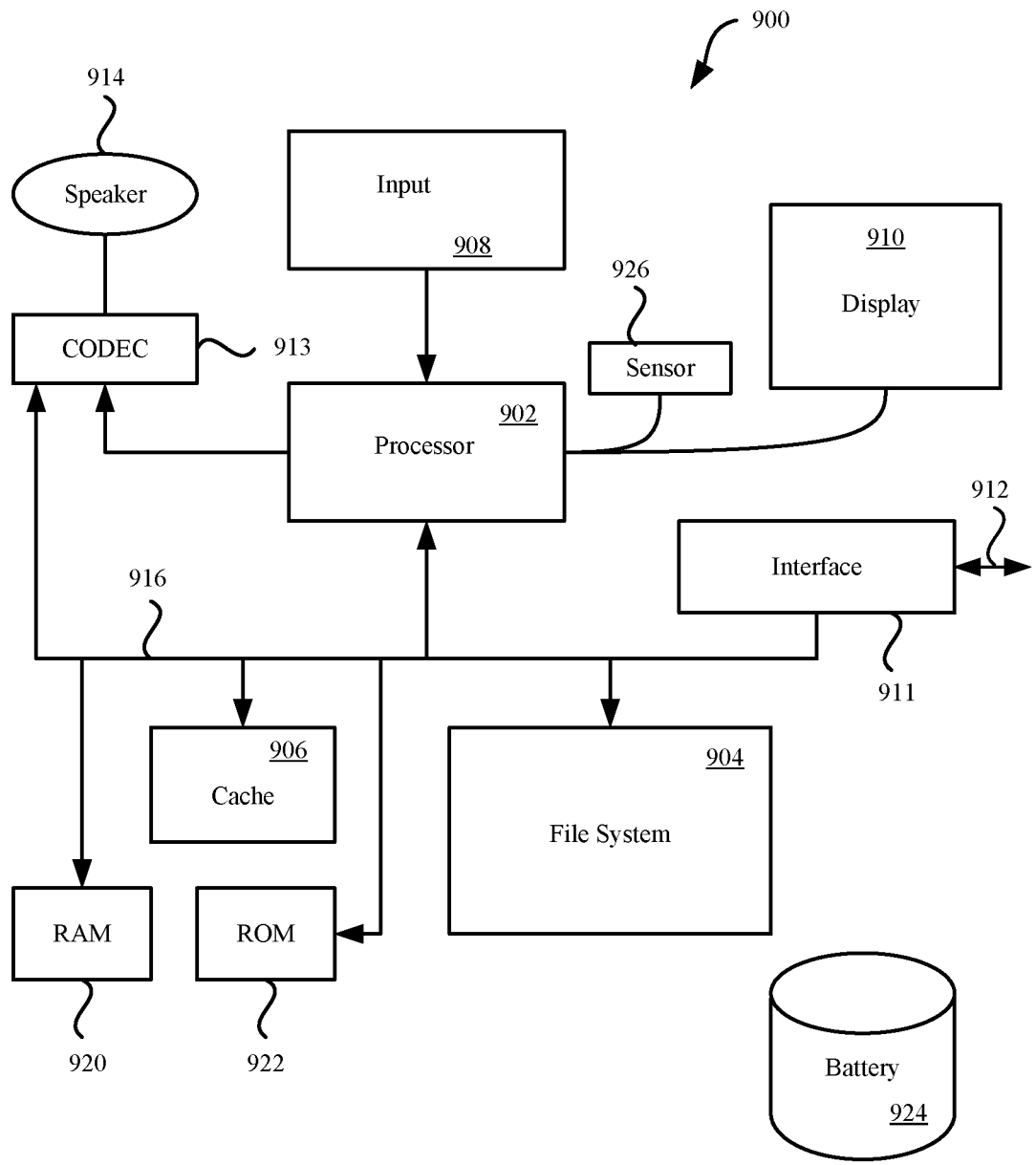
FIG. 9 shows a block diagram representing an electronic device suitable for controlling operations of internal components in accordance with the described embodiments.

FIG. 9 is a block diagram of electronic device 900 describing components suitable for controlling operations of internal components in accordance with the described embodiments. Electronic device 900 illustrates circuitry of a representative computing device. Electronic device 900 includes a processor 902 that pertains to a microprocessor or controller for controlling the overall operation of electronic device 900. Electronic device 900 contains instruction data pertaining to operating instructions in a file system 904 and a cache 906. The file system 904 is, typically, a storage disk or a plurality of disks. The file system 904 typically provides high capacity storage capability for the electronic device 900. However, since the access time to the file system 904 is relatively slow, the electronic device 900 can also include a cache 906. The cache 906 is, for example, Random-Access Memory (RAM) provided by semiconductor memory. The relative access time to the cache 906 is substantially shorter than for the file system 904. However, the cache 906 does not have the large storage capacity of the file system 904. Further, the file system 904, when active, consumes more power than does the cache 906. The power consumption is often a concern when the electronic device 900 is a portable device that is powered by a battery 924. The electronic device 900 can also include a RAM 920 and a Read-Only Memory (ROM) 922. The ROM 922 can store programs, utilities or processes to be executed in a non-volatile manner. The RAM 920 provides volatile data storage, such as for cache 906.

The electronic device 900 also includes a user input device 908 that allows a user of the electronic device 900 to interact with the electronic device 900. For example, the user input device 908 can take a variety of forms, such as a button, keypad, dial, touch screen, audio input interface, visual/image capture input interface, input in the form of sensor data, etc. Still further, the electronic device 900 includes a display 910 (screen display) that can be controlled by the processor 902 to display information to the user. A data bus 916 can facilitate data transfer between at least the file system 904, the cache 906, the processor 902, and a CODEC 913. The CODEC 913 can be used to decode and play a plurality of media items from file system 904 that can correspond to certain activities taking place during a particular manufacturing process. The processor 902, upon a certain operating event or events occurring, supplies the media data (e.g., audio file) for the particular media item to a coder/decoder (CODEC) 913. The CODEC 913 then produces analog output signals for a speaker 914. The speaker 914 can be a speaker internal to the electronic device 900 or external to the electronic device 900. For example, headphones or earphones that connect to the electronic device 900 would be considered an external speaker.

The electronic device 900 also includes a network/bus interface 911 that couples to a data link 912. The data link 912 allows the electronic device 900 to couple to a host computer or to accessory devices. The data link 912 can be provided over a wired connection or a wireless connection. In the case of a wireless connection, the network/bus interface 911 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 926 can take the form of circuitry for detecting any number of stimuli. For example, sensor 926 can include any number of sensors for monitoring various operating conditions of electronic device 900, such as for example a Hall Effect sensor responsive to external magnetic field, a temperature sensor, an audio sensor, a light sensor such as a photometer, a depth measurement device such as a laser interferometer and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
    a first component having a first surface and defining an air inlet extending through a wall of the first component;
    a second component having a second surface; and
    an adhesive layer in direct contact with both the first surface and the second surface; and
    a pneumatic release mechanism coupled with the air inlet of the first component and positioned proximate the first surface, wherein the first component is completely separated from the second component when the pneumatic release mechanism is inflated.

2. The electronic device as recited in claim 1, wherein the pneumatic release mechanism comprises an inlet manifold coupled with an inflatable member.

3. The electronic device as recited in claim 2, wherein the inflatable member is at least partially embedded within the adhesive layer.

4. The electronic device as recited in claim 2, wherein the inlet manifold is configured to supply air to a plurality of inflatable members.

5. The electronic device as recited in claim 2, wherein the inflatable member has a varying cross-sectional area.

6. The electronic device as recited in claim 2, wherein the inflatable member inflates in distinct stages causing the first component to be gradually separated from the second component.

7. The electronic device as recited in claim 2, wherein the first component is a first housing component and the second component is a second housing component that cooperates with the first housing component to form an electronic device housing.

8. The electronic device as recited in claim 7, wherein the pneumatic release mechanism is disposed within an internal volume defined by the electronic device housing.

9. A self-releasing adhesive layer for joining a first component to a second component, the self-releasing adhesive layer comprising:
    an adhesive substrate;
    wherein the first component is a first housing component and the second component is a second housing component that cooperates with the first housing component to define an interior volume; and
    a pneumatic release mechanism at least partially embedded within the adhesive substrate, wherein the pneumatic release mechanism severs a bond formed by the adhesive substrate between the first and second components when the pneumatic release mechanism is inflated.

10. The self-releasing adhesive bonding layer as recited in claim 9, wherein the pneumatic release mechanism comprises two sheets of polyester film sealed to one another around a peripheral edge of the two sheets to form an interior expandable volume.

11. The self-releasing adhesive bonding layer as recited in claim 10, wherein the pneumatic release mechanism further comprises an inlet for receiving pressurized gas.

12. The self-releasing adhesive bonding layer as recited in claim 9, wherein the pneumatic release mechanism comprises an elastomeric tube.

13. The self-releasing adhesive bonding layer as recited in claim 9, wherein the first component is a battery cell and the second component is a housing component.

14. The self-releasing adhesive bonding layer as recited in claim 9, wherein the adhesive substrate keeps the housing components together and enclosing a plurality of electrical components within the interior volume.

15. A portable electronic device, comprising:
    a first housing component;
    a second housing component that cooperates with the first housing component to define an interior volume;
    an adhesive layer joining the first housing component to the second housing component at a bonding region; and
    a pneumatic release mechanism at least a portion of which is disposed within the interior volume, wherein the pneumatic release mechanism is configured to completely separate the first housing component from the second housing component when the pneumatic release mechanism is inflated.

16. The portable electronic device as recited in claim 15, further comprising:
    an inlet manifold configured to receive compressed gas through an opening in the first housing component and to distribute the gas to the pneumatic release mechanism.

17. The portable electronic device as recited in claim 16, wherein the pneumatic release mechanism comprises a plurality of inflatable members, and wherein the inlet manifold is configured to distribute the gas to the plurality of separate inflatable members of the pneumatic release mechanism.

18. The portable electronic device as recited in claim 17, wherein the inlet manifold is configured to distribute gas to the plurality of inflatable members sequentially.

19. The portable electronic device as recited in claim 15, wherein the pneumatic release mechanism comprises an elastomeric tube configured to exert a separating force upon both the first and second housing components proximate the bonding region.

\* \* \* \* \*